Aug. 1, 1967 L. C. DREW ETAL 3,334,246
TECHNIQUE FOR GATING A VHF-UHF SIGNAL
Filed Nov. 23, 1964
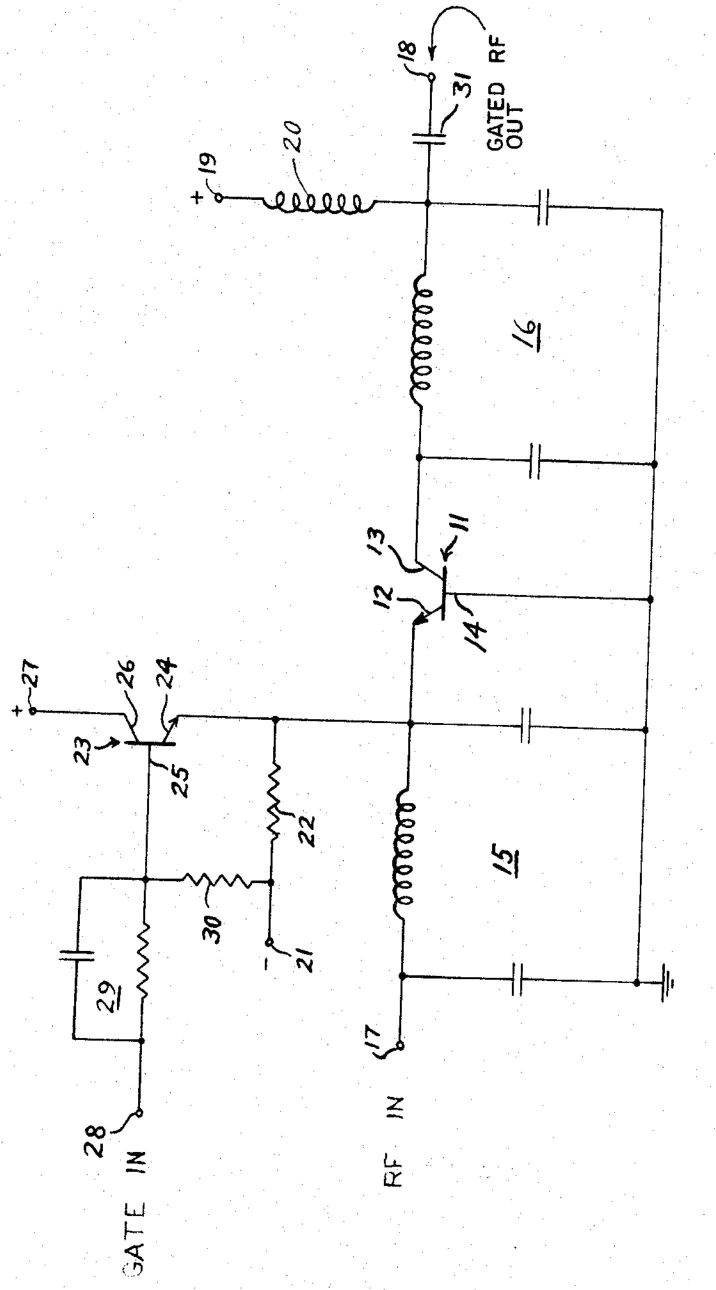
INVENTORS.
Laurence C. Drew
Harry K. Schlegelmilch
By: Harry M. Saragovitz,
Edward J. Kelly, Herbert Berl &
Julian C. Keppler

United States Patent Office 3,334,246

Patented Aug. 1, 1967

3,334,246

TECHNIQUE FOR GATING A VHF-UHF SIGNAL

Laurence C. Drew, Danvers, and Harry K. Schlegelmilch, Carlisle, Mass., assignors to the United States of America as represented by the Secretary of the Army Filed Nov. 23, 1964, Ser. No. 413,383
3 Claims. (Cl. 307—88.5)

This invention relates to gating circuits and more particularly to transistor gating circuits which permit high speed switching of a VHF-UHF signal and yet provide a good isolation between "on" and "off" conditions.

In such applications as high-resolution ranging systems which employ gated input digital counters to determine distance, a minimum clock rate of 150 mc. is necessary to provide adequate resolution. The output of the oscillator which provides this high frequency clock signal is gated to the counting circuits by a gated amplifier. This amplifier acts as a buffer between the oscillator and the counter driver stage, and it also provides the necessary peak voltage at the driver input. Of the several methods explored in gating this amplifier, only the one described herein proved to be successful. The main cause for the failure of the unsuccessful gating methods is that the impedance of a saturated transistor or diode is not low enough, at 150 mc., to act as a shunt or series switch, and therefore, "on" and "off" levels are nearly equal.

Therefore, an object of this invention is to provide a gated transistor amplifier for use at VHF-UHF frequencies, which provides good isolation between "on" and "off" conditions.

Another object of this invention is to provide a gated transistor amplifier which acts as a buffer amplifier when in its "on" state, and which provides more than adequate isolation when in its "off" state.

The gated amplifier in accordance with the present invention uses a current-robbing technique for operation. A grounded-base amplifier stage has impedance matching networks in both its input and output circuits to provide good isolation. The RF input is coupled through this amplifier. A gate transistor has its emitter connected to the emitter of the amplifier transistor. The emitters are connected to a source of bias by a bias resistor. When the gate transistor is turned "on" the bias on the emitter of the amplifier transistor turns it "off" and no RF energy passes through the amplifier. This is accomplished by diverting current for the gate from the amplifier current source which is made up of the bias source and the bias resistor. The resulting gated amplifier is capable of very fast switching.

Other objects and advantages of the present invention will be apparent from a consideration of the following description taken in connection with the accompanying drawing in which the figure shows a schematic circuit diagram of a preferred embodiment of the gated amplifier of the present invention.

The amplifier portion of the circuit comprises a grounded-base transistor 11 having an emitter 12, a collector 13, and a base 14. Impedance matching networks 15 and 16 are connected to the input and output circuits of the amplifier. A terminal 17 is connected to an RF oscilllator. The gated output signal is coupled from the collector 13 to an output terminal 18 by the matching network 16 and a variable capacitor 31. A bias voltage source 19 is connected to the amplifier transistor 11 by an inductor 20. A bias voltage 21 is connected to emitter 12 by a resistor 22.

The gate portion of the circuit comprises a transistor 23 having an emitter 24, a base 25, and a collector 26 which is directly connected to a bias source 27. The gate input signal which appears at terminal 28 is coupled through a parallel RC network 29 to the base 25. The bias source 21 is coupled to base 25 by a resistor 30.

When the gate transistor 23 is turned "on" due to the application of a positive gate pulse at terminal 28, the emitter 12 of transistor 11 is held positive, turning that transistor "off", and no RF energy passes through the amplifier. This is accomplished by robbing current for the gate transistor 23 from the amplifier current source which consists of the bias supply 21 and resistor 22. Holding transistor 11 "off" in this manner provides more than adequate isolation. This circuit has proven capable of switching from one state to another within one cycle of the RF oscillator signal. The technique herein described permits high speed switching of a VHF-UHF signal and provides a minimum of 40 db isolation from "on" to "off" conditions.

What is claimed is:

1. A gated amplifier for gating a high frequency RF signal comprising: a first transistor having emitter, base, and collector electrodes, the base electrode of said first transistor being connected to a source of reference potential; an RF signal source; impedance matching means for connecting said RF source to the emitter electrode of said first transistor; an output terminal; means connecting the collector electrode of said first transistor to said output terminal; a current source connected to the emitter electrode of said first transistor; a second transistor having emitter, base, and collector electrodes; a gate input terminal; first and second means respectively connecting said gate input terminal and said current source to the base electrode of said second transistor, the emitter electrode of said second transistor being directly connected to the emitter electrode of said first transistor, and the collector electrode of said second transistor connected to another current source.

2. A gated amplifier as set forth in claim 1 wherein said current source comprises a source of bias voltage and a resistor connected to said transistor emitter electrodes.

3. A gated amplifier for gating a high frequency RF signal comprising: a first transistor having emitter, base, and collector electrodes, the base electrode of said first transistor being connected to a source of reference potential; an RF signal source; first impedance matching means for connecting said RF source to the emitter electrode of said first transistor; an output terminal; second impedance matching means for connecting the collector electrode of said first transistor to said output terminal; a first source of bias voltage connected to said second impedance matching means; a second source of bias voltage; a resistor connected between said second source and the emitter electrode of said first transistor for supplying current thereto; a second transistor having emitter, base, and collector electrodes; a third source of bias voltage connected to the collector electrode of said second transistor; a gate input terminal; first and second means respectively connecting said gate input terminal and said second source to the base electrode of said second transistor; the emitter electrode of said second transistor being directly connected to the emitter electrode of said first transistor, a pulse at said gating input terminal turning said second transistor "on", thereby turning said first transistor "off", said second transistor drawing the current from said second bias source and said resistor while said second transistor is "on", thereby depriving said first transistor of said current.

References Cited

UNITED STATES PATENTS

| | | | |
|---|---|---|---|
| 3,106,646 | 10/1963 | Carter | 307—88.5 |
| 3,123,721 | 3/1964 | Kaufman | 307—88.5 |
| 3,260,859 | 7/1966 | Dessoul Avy | 307—88.5 |
| 3,315,120 | 4/1967 | Yanishevsky | 330—30 X |

OTHER REFERENCES

Electronic and Radio Engineering, by Terman, 4th ed. (Copyright 1955.) Chap. 4–12, pp. 112–115. (Copy in Scientific Library, TK6550T4.)

ARTHUR GAUSS, *Primary Examiner*.

J. S. HEYMAN, *Assistant Examiner*.